United States Patent
Han et al.

(10) Patent No.: US 10,763,247 B2
(45) Date of Patent: Sep. 1, 2020

(54) LED DISPLAY AND ELECTRONIC DEVICE HAVING SAME

(71) Applicant: SAMSUNG ELECTRONICS CO., LTD., Suwon-si, Gyeonggi-do (KR)

(72) Inventors: Sangtae Han, Suwon-si (KR); Taesang Park, Suwon-si (KR); Changsun Kang, Suwon-si (KR); Mijin Kim, Suwon-si (KR); Kyoree Lee, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/275,607

(22) Filed: Feb. 14, 2019

(65) Prior Publication Data
US 2019/0326267 A1 Oct. 24, 2019

(30) Foreign Application Priority Data
Apr. 24, 2018 (KR) .................. 10-2018-0047116

(51) Int. Cl.
H01L 25/16 (2006.01)
H01L 23/538 (2006.01)
(Continued)

(52) U.S. Cl.
CPC ............ H01L 25/167 (2013.01); G09G 3/32 (2013.01); H01L 21/76802 (2013.01);
(Continued)

(58) Field of Classification Search
CPC .......... G09G 3/2092; G09G 3/32; G09G 5/00; G09G 2300/0426; G09G 2300/0804;
(Continued)

(56) References Cited

U.S. PATENT DOCUMENTS 9,048,203 B2 * 6/2015 Yamazaki ......... H01L 21/67207
257/88
2005/0135697 A1 6/2005 Fiete
(Continued)

OTHER PUBLICATIONS

International Search Report dated May 24, 2019 in counterpart International Patent Application No. PCT/KR2019/001669 and English-language translation.
(Continued)

Primary Examiner — Nelson M Rosario
(74) Attorney, Agent, or Firm — Nixon & Vanderhye P.C.

(57) ABSTRACT

A display according to various embodiments may include: a first face oriented in a first direction; a second face oriented in a second direction opposite the first direction; a plurality of pixels disposed in a space between the first face and the second face; and a plurality of pins disposed on the second face and configured to electrically connect the plurality of pixels to an external device. Each of the plurality of pixels may include a plurality of LEDs and a driving circuit. A conductive pattern configured to electrically connect the plurality of LEDs to the driving circuit may be located in the space and a wiring line configured to electrically connect the driving circuit to the plurality of pins may be located in the space.

13 Claims, 12 Drawing Sheets

(51) Int. Cl.
    *H01L 27/12*     (2006.01)
    *H01L 21/768*     (2006.01)
    *H01L 23/00*     (2006.01)
    *G09G 3/32*     (2016.01)
    *H01L 33/62*     (2010.01)

(52) U.S. Cl.
CPC .... *H01L 21/76877* (2013.01); *H01L 23/5384* (2013.01); *H01L 23/5386* (2013.01); *H01L 23/5389* (2013.01); *H01L 24/24* (2013.01); *H01L 24/82* (2013.01); *H01L 27/124* (2013.01); *H01L 27/1218* (2013.01); *H01L 33/62* (2013.01); *G09G 2300/0804* (2013.01); *H01L 27/1255* (2013.01); *H01L 2224/24137* (2013.01); *H01L 2224/821* (2013.01); *H01L 2924/12041* (2013.01); *H01L 2924/13069* (2013.01); *H01L 2924/1426* (2013.01); *H01L 2933/0066* (2013.01)

(58) Field of Classification Search
CPC ......... H01L 21/76802; H01L 21/76877; H01L 23/5384; H01L 23/5386; H01L 23/5389; H01L 24/24; H01L 24/82; H01L 25/0753; H01L 25/167; H01L 27/1218; H01L 27/124; H01L 33/62; H01L 2224/04105; H01L 2224/24137; H01L 2224/24226; H01L 2224/32225; H01L 2224/73204; H01L 2224/73267; H01L 2224/81192; H01L 2224/821; H01L 2224/83192; H01L 2224/83862; H01L 2224/83874; H01L 2224/92244; H01L 27/1255; H01L 2924/12041; H01L 2924/13069; H01L 2924/1426; H01L 2924/15153; H01L 2933/0066

See application file for complete search history.

(56) References Cited

U.S. PATENT DOCUMENTS

| | | |
|---|---|---|
| 2006/0214287 A1 | 9/2006 | Ogihara et al. |
| 2012/0056190 A1 | 3/2012 | Yamazaki et al. |
| 2015/0084019 A1 | 3/2015 | Ren |
| 2015/0169011 A1 | 6/2015 | Bibl et al. |
| 2017/0294451 A1 | 10/2017 | Kim et al. |

OTHER PUBLICATIONS

Written Opinion dated May 24, 2019 in counterpart International Patent Application No. PCT/KR2019/001669 and English-language translation.

\* cited by examiner

LED DISPLAY AND ELECTRONIC DEVICE HAVING SAME

CROSS-REFERENCE TO RELATED APPLICATION

This application is based on and claims priority under 35 U.S.C. § 119 to Korean Patent Application No. 10-2018-0047116, filed on Apr. 24, 2018, in the Korean Intellectual Property Office, the disclosure of which is incorporated by reference herein in its entirety.

BACKGROUND

1) Field

The present disclosure relates to an LED display and an electronic device including the same.

2) Description of Related Art

Organic light-emitting diode (OLED) displays are gaining popularity as a technology to replace liquid crystal displays (LCDs). However, high cost, yield, enlargement, and reliability issues remain as problems to be solved.

In recent years, micro-LEDs have attracted attention for use as a next-generation display technology. Micro-LEDs are able to express red, green, and blue (RGB) with self-emission, and a single chip is able to implement one subpixel (one of R, G, and B) due to a small size (less than 100 μm). Accordingly, it is not necessary to use a backlight unit (BLU), and it is possible to provide a higher resolution. OLEDs also emit their own light. However, the lifespan of OLEDs is shorter than that of micro-LEDs, and the power consumption of OLEDs is higher than that of micro-LEDs.

The above information is presented as background information only to assist with an understanding of the present disclosure. No determination has been made, and no assertion is made, as to whether any of the above might be applicable as prior art with regard to the present disclosure.

SUMMARY

Various embodiments of the present disclosure may provide a display including micro-LEDs and an electronic device including the display.

In addition, various embodiments of the present disclosure may provide a display manufactured through a method of directly mounting micro-LEDs on a substrate and an electronic device including the display.

In addition, various embodiments of the present disclosure may provide a bezel-less LED display and an electronic device including the display.

In addition, various embodiments of the present disclosure may enable segmentation of an LED display, thereby providing various sizes of displays and flexible displays.

A first display according to various example embodiments of the present disclosure may include: a first face oriented in a first direction; a second face oriented in a second direction opposite the first direction; a plurality of pixels disposed in a space between the first face and the second face; and a plurality of pins disposed on the second face and configured to electrically connect the plurality of pixels to an external device. Each of the plurality of pixels may include a plurality of LEDs and a driving circuit, the plurality of LEDs may be disposed in the space such that light-emitting portions thereof face the first face, a conductive pattern configured to electrically connect the plurality of LEDs to the driving circuit may be located in the space, at least a portion of the conductive pattern being located above the plurality of LEDs when viewed from above the second face, and a wiring line configured to electrically connect the driving circuit to the plurality of pins may be located in the space, the wiring line being located above the plurality of LEDs when viewed from above the second face.

An electronic device according to various embodiments of the present disclosure may include: a display driver IC; a power management device comprising power management circuitry; the first display, electrically connected to the display driver IC and to the power management device; and a processor electrically connected to the display driver IC and to the power management device.

A second display according to various example embodiments of the present disclosure may include: a first face oriented in a first direction; a second face oriented in a second direction substantially opposite the first direction; and a plurality of pixels disposed in a space between the first face and the second face. Each of the plurality of pixels may include a plurality of LEDs and a driving circuit chip, the plurality of LEDs may be disposed in the space such that light-emitting portions thereof face the first face, a conductive pattern configured to electrically connect the plurality of LEDs to the driving circuit chip may be located in the space, at least a portion of the conductive pattern being located above the plurality of LEDs when viewed from above the second face, a wiring line configured to electrically connect the driving circuit chip to the plurality of pins may be located in the space, the wiring line being located above the plurality of LEDs when viewed from above the second face, the second face may be one face of glass, the wiring line may be formed on another face of the glass and may be connected to a via that passes through the one face and the another face, and the plurality of pixels may be connected to an external device via the via.

An electronic device according to various example embodiments of the present disclosure may include: a display driver IC; a power management device comprising power management circuitry; the second display electrically connected to the display driver IC and to the power management device; and a processor electrically connected to the display driver IC and to the power management device.

According to various example embodiments of the present disclosure, it is possible to make an electrical connection between an LED and a drive circuit robust. In addition, it is possible to implement a bezel-less display without a side wiring line. In addition, it is possible to cut a display into a plurality of units, thereby enabling segmentation of the display. For example, it is possible to manufacture displays of various sizes through a process of connecting display units to each other. Also, it is possible to fabricate a flexible display using display units.

BRIEF DESCRIPTION OF THE DRAWINGS

The above and/or other aspects, features and attendant advantages of the present disclosure will become more apparent and readily appreciated from the following detailed description, taken in conjunction with the accompanying drawings, in which like reference numerals refer to like elements, and wherein.

DETAILED DESCRIPTION

Figure 1:
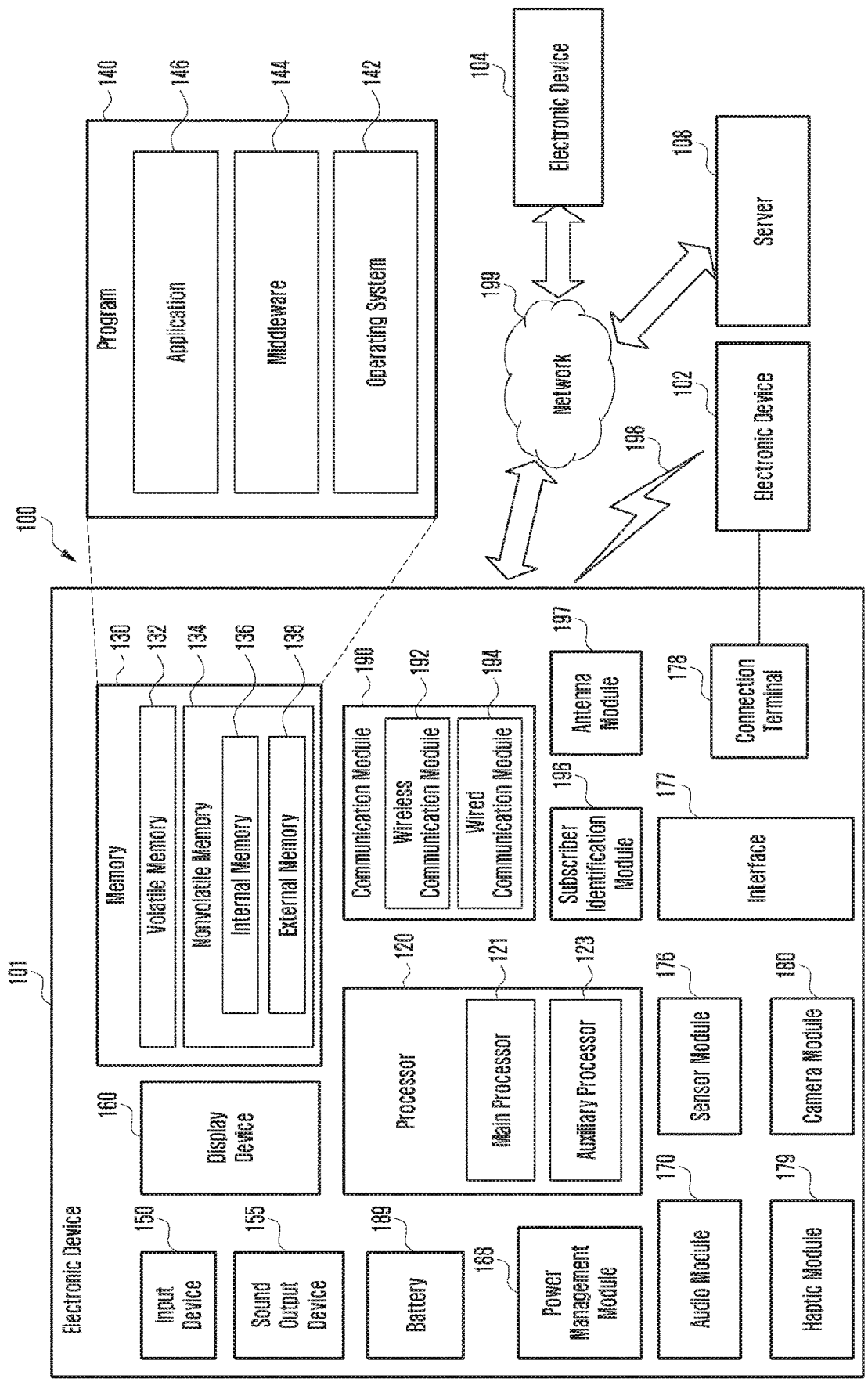
FIG. 1 is a diagram illustrating an electronic device within a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance.

According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combinations thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
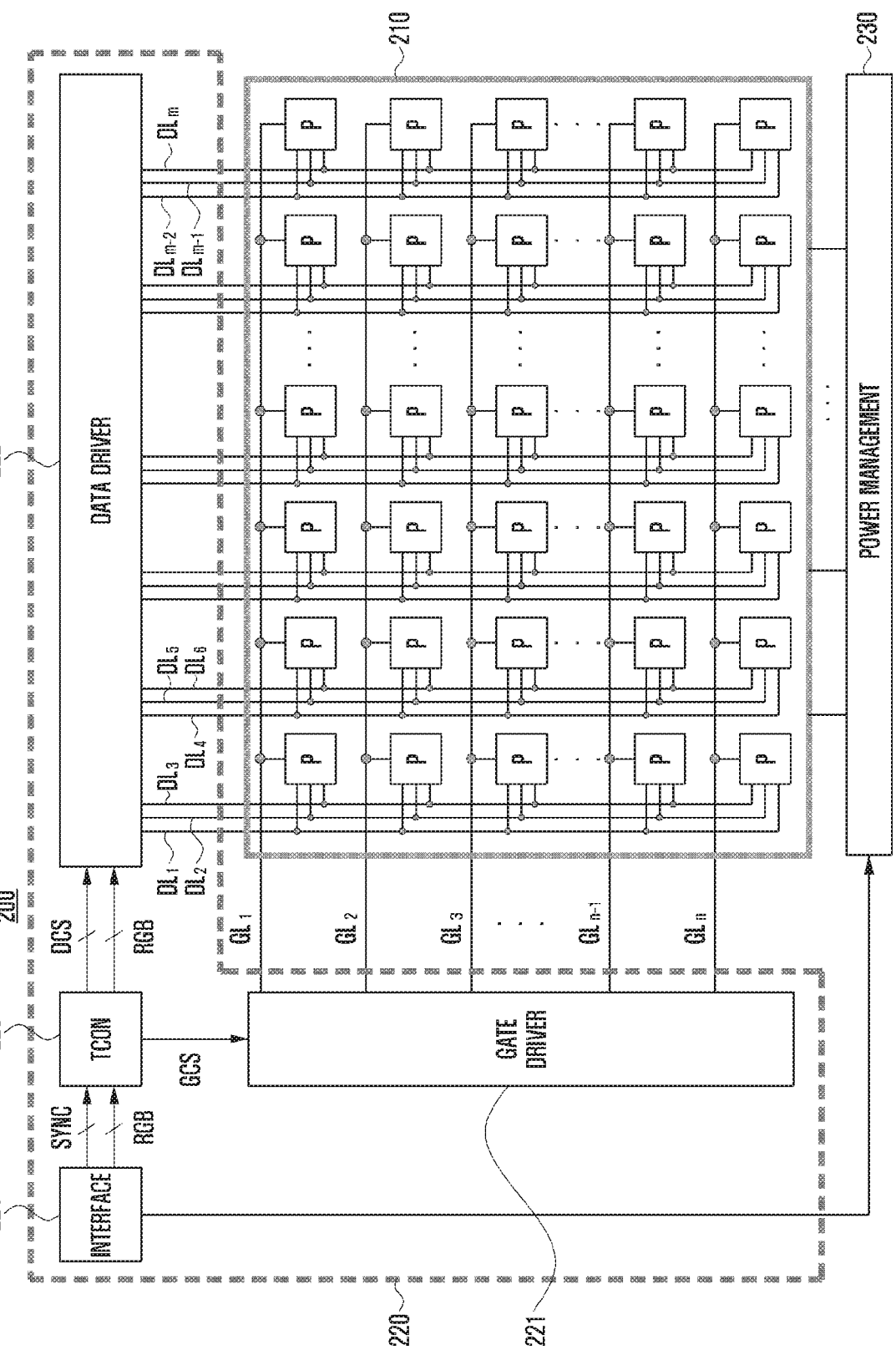
FIG. 2 is a block diagram illustrating an example display device according to various embodiments.

FIG. 2 is a block diagram illustrating an example display device according to various embodiments. Referring to FIG. 2, a display device 200 (e.g., the display device 160 in FIG. 1) may include a display 210 and a display driver IC (DDI) 220 for controlling the display 210. The DDI 220 may include a gate driver 221, a data driver 222, a timing controller (TCON) 223, and an interface block 224.

According to various embodiments, the display 210 may include a plurality of gate wiring lines GL1 to GLn, a plurality of data wiring lines DL1 to DLm intersecting the gate wiring lines GL1 to GLn, and a plurality of pixels P formed in the regions where the gate wiring lines GL and the data wiring lines DL intersect each other.

According to various embodiments, each pixel P may include a plurality of subpixels (e.g., R (red), G (green), and B (blue) pixels). Each of the subpixels may include a light-emitting diode (e.g., a micrometer-sized micro-LED) that emits light of a corresponding color and a driving circuit (not illustrated) for driving the light-emitting diode. The driving circuit may include at least one thin film transistor and at least one capacitor and may be electrically connected to any one of the gate wiring lines GL and electrically connected to any one of the data wiring lines DL. The driving circuit is capable of charging the capacitor with data voltage supplied from the data driver 222 via a connected data wiring line DL in response to a scan signal received from the gate driver 221 through a connected gate wiring line GL. The driving circuit is capable of controlling the amount of current supplied to the LED depending on the data voltage charged in the capacitor. For example, each subpixel is capable of displaying visual information at least based on a scan signal and a data signal.

Although not illustrated, the display 210 may further include various signal wiring lines for driving the pixels P (e.g., Sens wiring lines, L-TEST wiring lines, TEST wiring lines) and power wiring lines for supplying power to the pixels P (e.g., VDD wiring lines, VSS wiring lines, and Vcas wiring lines) in addition to the signal wiring lines.

According to various embodiments, the gate driver 221 may supply a scan signal to the plurality of gate wiring lines GL1 to GLn in response to at least one gate control signal GCS provided from the timing controller 223. The gate driver 221 may include a gate shift register configured to output scan signals (scan pulses). The scan signals are sequentially supplied to each pixel P, and each scan signal may include a single signal or a plurality of signals. When each of the scan signals includes a plurality of signals, each gate wiring line GL may include a plurality of wiring lines configured to supply a plurality of scan signals to each pixel P.

According to various embodiments, the data driver 222 may convert image data (RGB) provided from the timing controller 223 into a data voltage in response to at least one data control signal DCS provided from the timing controller 223. The data driver 222 may generate a data voltage using a plurality of gamma compensation voltages. The data driver 222 may sequentially supply the generated data voltages to the plurality of pixels P in a line unit, for example, on a row-by-row basis. The data driver 222 may include a data shift register configured to output a sampling signal, a latch circuit configured to latch image data in a row-by-row basis in response to a sampling signal, a digital-to-analog converter configured to convert latched image data into an analog gradation voltage (pixel voltage), and so on.

According to various embodiments, the timing controller (TCON) 223 may align the image data (RGB) provided from the interface block 224 to be suitable for the size and resolution of the display 210. The timing controller 223 may supply the data driver 222 with the aligned image data (RGB). The timing controller 223 may transmit a plurality of control signals GCS and DCS using at least one synchronization signal SYNC provided from the interface block 224. The plurality of control signals GCS and DCS may include at least one gate control signal GCS and at least one data control signal DCS. The gate control signal GCS may be a signal for controlling the driving timing of the gate driver 221. The data control signal DCS may be a signal for controlling the driving timing of the data driver 222. The synchronization signals SYNC may include, for example, and without limitation, a dot clock DCLK, a data enable signal DE, a horizontal synchronization signal Hsync, and/or a vertical synchronization signal Vsync. According to an embodiment, the interface block 224 may receive image data (RGB) from a processor (e.g., the processor 120 in FIG. 1) such as an application processor, and may transmit the received image data RGB to the timing controller 223. The interface block 224 may generate and transmit at least one synchronization signal SYNC to the timing controller 223. The interface block 224 may control a power management device 230 to supply at least one driving voltage to the display 210.

According to various embodiments, the power management device (e.g., including power management circuitry) 230 (e.g., the power management module 188 in FIG. 1) may include various power management circuitry and generates at least one drive voltage required to drive the display 210 and supplies the generated drive voltage to the display 210. The at least one drive voltage may include, for example, and without limitation, VDD, VSS (GND), a gate-on voltage, a gate-off voltage, or an initialization voltage. The gate-on voltage may be a voltage to turn on at least one thin film transistor provided in the display 210. The gate-off voltage may be a voltage to turn off at least one thin film transistor provided in the display 210. The initialization voltage may be a voltage to initialize a certain node in a driving circuit for driving at least one subpixel among the plurality of subpixels.

Figure 3:
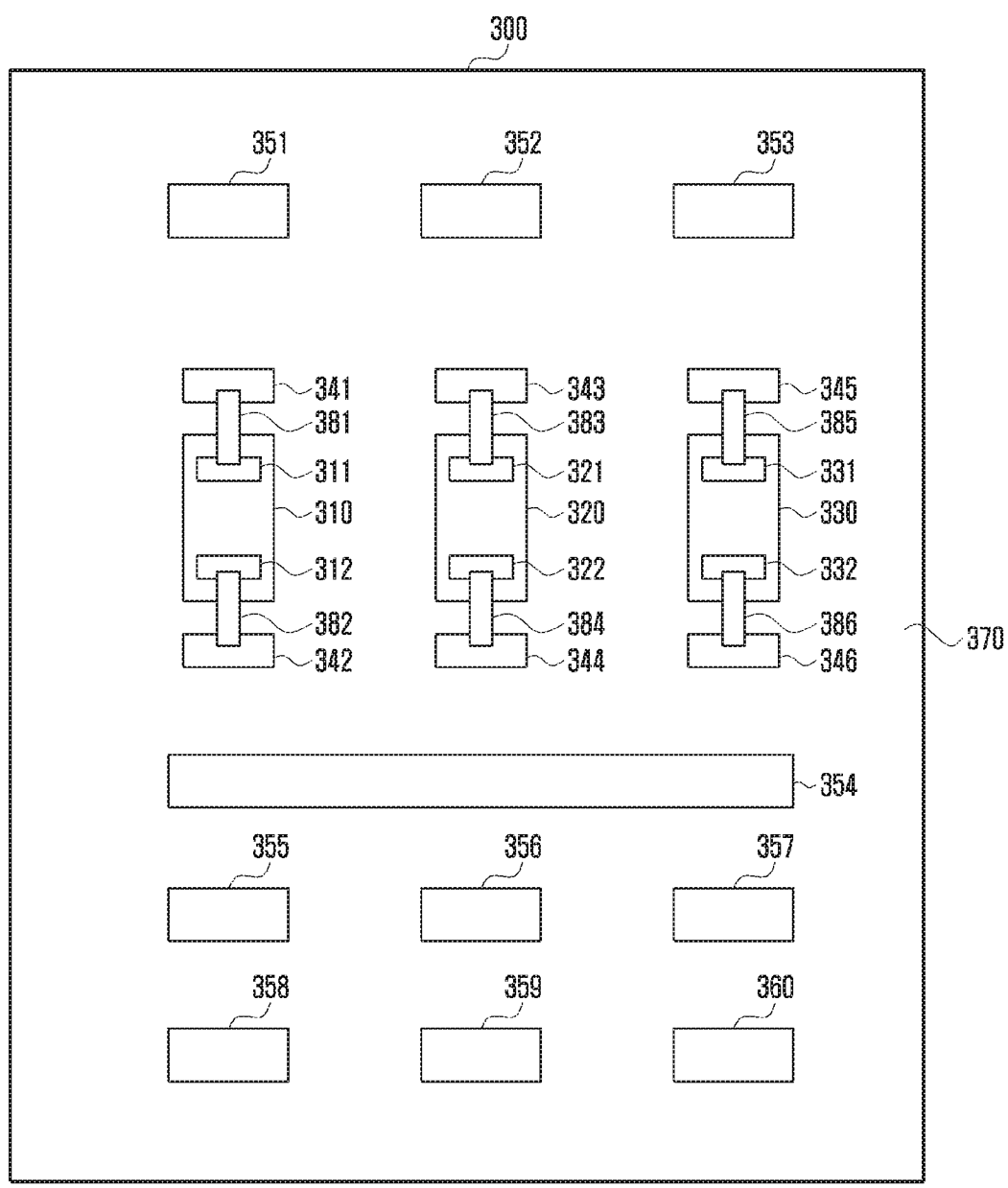
FIG. 3 is a diagram illustrating a pixel according to various embodiments.

FIG. 3 is a diagram illustrating an example pixel according to various embodiments. Referring to FIG. 3, a pixel 300 of a display (e.g., the display 210 in FIG. 2) may include a plurality of LEDs 310, 320, 330 and a plurality of conductive pads 341, 342, 343, 344, 345 and 346 and 351, 352, 353, 354, 355, 356, 357, 358, 359 and 360, and may be configured in a pixel region 370 (e.g., a region where a gate wiring ling GL and a data wiring line DL intersect each other, as illustrated in FIG. 2). For example, the LEDs 310, 320, and 330 may include an R (red) LED, a G (green) LED, and a B (blue) LED, respectively.

According to various embodiments, each of conductive pads (hereinafter, simply referred to as "pads") 341 to 346 and 351 to 360 may be any one node or terminal in a driving circuit (not illustrated) disposed in the pixel region 370.

According to an embodiment, each of the first to sixth pads 341, 342, 343, 344, 345 and 346 may be any one portion of the driving circuit. A first electrode 311 and a second electrode 312 of the R LED 310 are electrically connected to a first pad 341 and a second pad 342 via a first conductive pattern 381 and a second conductive pattern 382, respectively. A first electrode 321 and a second electrode 322 of the G LED 320 are electrically connected to a third pad 343 and a fourth pad 344 via a third conductive pattern 383 and a fourth conductive pattern 384, respectively. A first electrode 331 and a second electrode 332 of the B LED 330 are electrically connected to a fifth pad 345 and a sixth pad 346 via a fifth conductive pattern 385 and a sixth conductive pattern 386, respectively. A seventh pad 351, an eighth pad 352, and a ninth pad 353 may be signal terminals of a driving circuit, which are connected to respective data wiring lines disposed on the display. A tenth pad 354 may be a power terminal of a driving circuit electrically connected to a power wiring line (e.g., a VDD wiring) disposed on the display. The remaining pads 355, 356, 357, 358, 359 and 360 may be terminals electrically connected to power wiring lines or signal wiring lines disposed on the display. For example, an eleventh pad 355 may be a power terminal connected to a VSS wiring line, a twelfth pad 356 may be a signal terminal connected to a gate wiring line, and a thirteenth pad 357 may be a signal terminal connected to a signal wiring line for driving a transistor, a fourteenth pad 358 may be a signal terminal connected to a first inspection wiring line for inspecting the transistor, a fifteenth pad 359 may be a signal terminal connected to a second inspection wiring line, and a sixteenth pad 360 may be a power terminal connected to a power wiring line for compensating for a threshold voltage of the transistor or a current flowing in the LED.

Figure 4A:
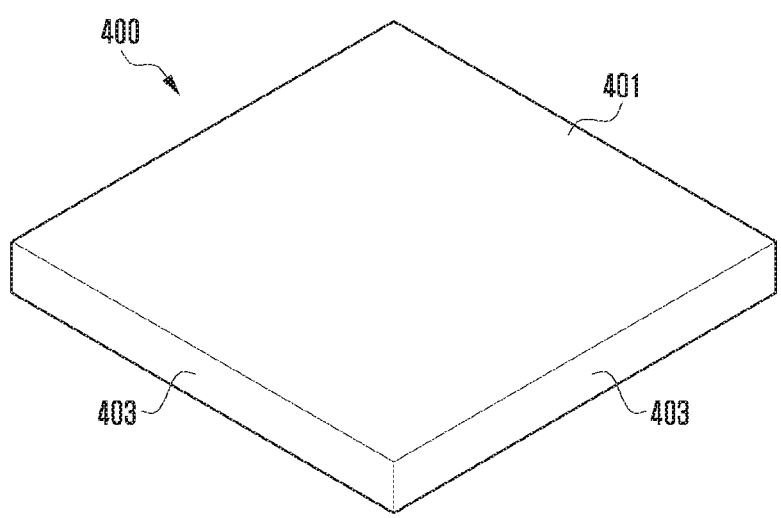
FIG. 4A is a diagram illustrating the front side of a display according to various embodiments.
Figure 4A:
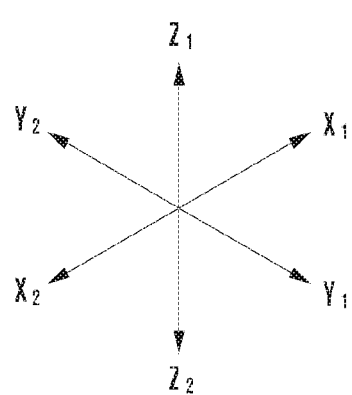
Figure 4B:
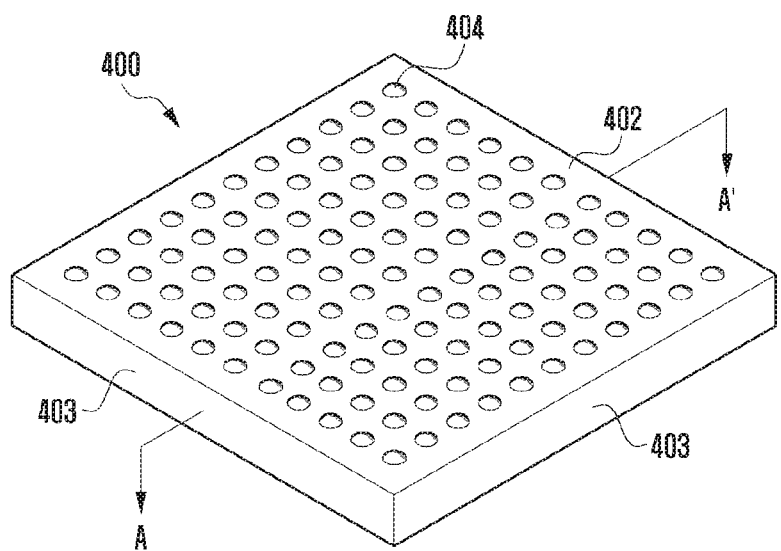
FIG. 4B is a diagram illustrating the rear side of the display illustrated in FIG. 4A.
Figure 4B:
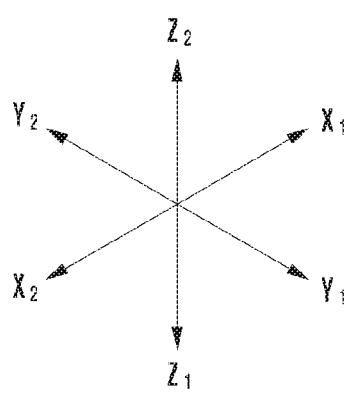
Figure 4C:
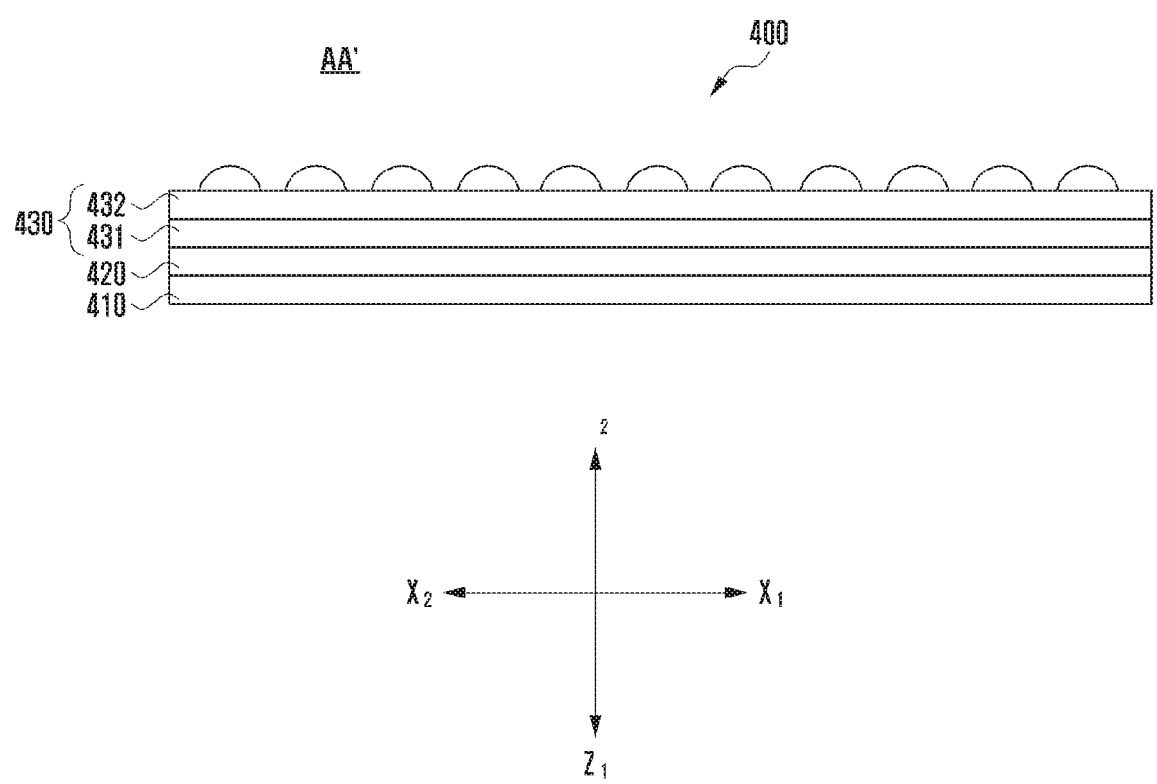
FIG. 4C is a diagram taken by cutting the display illustrated in FIG. 4B along line A-A'.
Figure 4D:
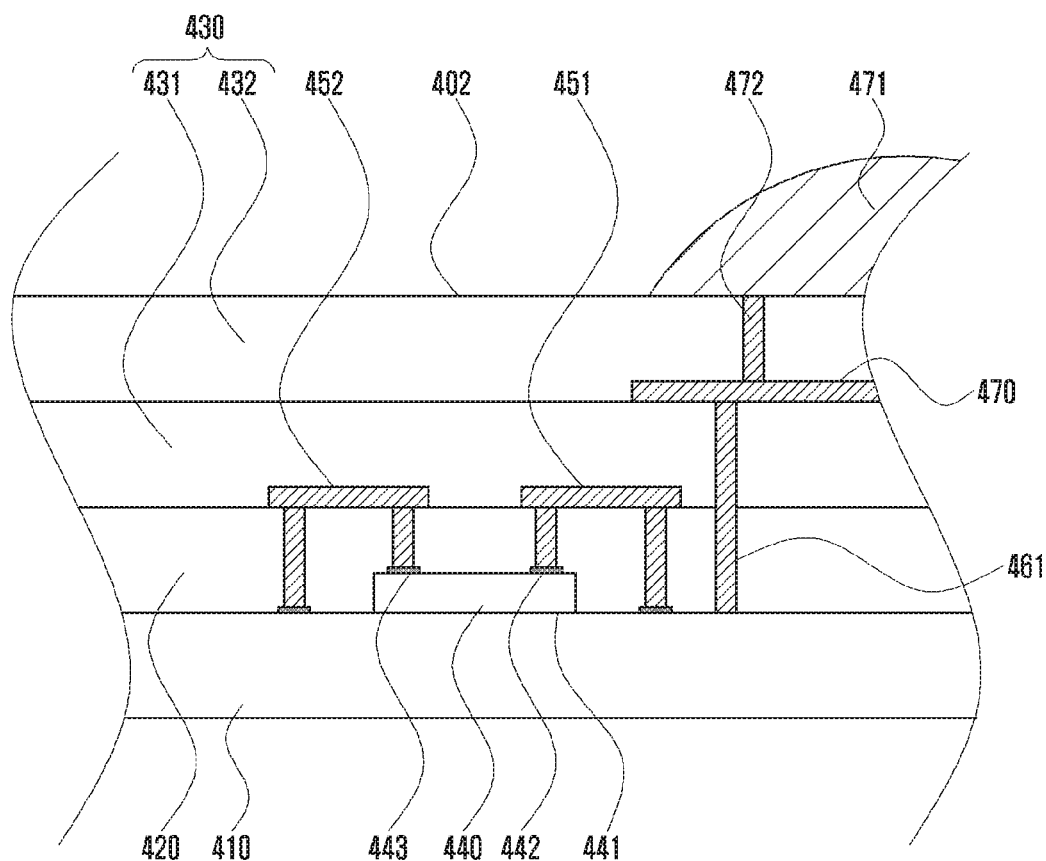
FIG. 4D is a diagram illustrating a portion (pixel region) in the cut face illustrated in FIG. 4C.
Figure 4D:
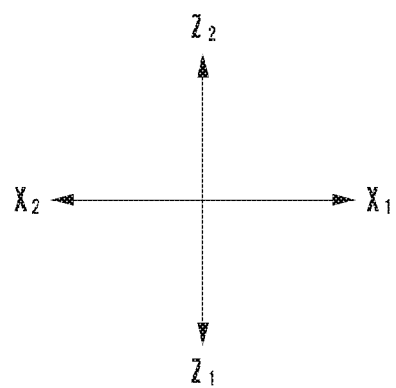

FIG. 4A is a diagram illustrating the front side of a display according to various embodiments, FIG. 4B is a diagram illustrating the rear side of the display illustrated in FIG. 4A, FIG. 4C is a diagram taken by cutting the display illustrated in FIG. 4B along line A-A', and FIG. 4D is a diagram illustrating a portion (pixel region) in the cut face illustrated in FIG. 4C.

Referring to FIGS. 4A and 4B, a display 400 (e.g., the display 210 in FIG. 2) according to various embodiments may include a first face (or a front face) 401 oriented in a first direction Z1, a second face (or a rear face) 402 oriented in a second direction Z2 that is substantially opposite the first direction, and a side face 403 surrounding a space between the first face 401 and the second face 402.

According to various embodiments, at least a portion of the first face 401 may form a display region. That is, the light (visual information) emitted from a plurality of pixels located in the space may be displayed to the outside through the display region.

According to various embodiments, the second face 402 may be provided with a plurality of pins 404. The plurality of pins 404 may be terminals for electrically connecting the display 400 with at least one external device (e.g., the DDI 220 and power management device 230 in FIG. 2). For example, the plurality of pins 404 may be disposed on the second face 402 in the form of a ball grid array (BGA).

Referring to FIG. 4C, the display 400 according to various embodiments may include a first layer 410, a second layer 420, and a third layer 430.

According to various embodiments, the first layer 410 includes a substrate, gate wiring lines (e.g., "GL1 to GLn" in FIG. 2) disposed on the substrate, data wiring lines (e.g., "DL1 to DLm" in FIG. 2), and driving circuits, which are respectively formed in pixel regions (e.g., the pixel regions 370 in FIG. 3) in which gate wiring lines and data wiring lines intersect each other. The substrate may, for example, and without limitation, be made of glass or a plastic material, and may form the first face 401 of the display 400.

According to various embodiments, the second layer 420 may include a plurality of LEDs. For example, R, G, and B LEDs may be located on a pixel region of the first layer 410.

According to various embodiments, the third layer 430 may form a second face 402 of the display 400. The third layer 430 may include a conductive pattern layer 431 and a wiring layer 432 formed on the conductive pattern layer 431 when viewed from above the second face 402. The conductive pattern layer 431 may include at some of conductive patterns (e.g., the conductive patterns 381 to 386 in FIG. 3) for electrically connecting the R, G, and B LEDs to the driver circuit. The wiring layer 432 may include a power wiring line for electrically connecting a power wiring line disposed in the first layer 410 to a power pin disposed on the second face 402 and a power wiring line for electrically connecting a signal wiring line disposed in the first layer 410 to a signal pin disposed in the second face 402.

According to various embodiments, a wiring line disposed in the wiring layer 432 may be referred to as a rewiring line in order to distinguish it from a wiring line formed in the first layer 410, and the wiring layer may also be referred to as a rewiring layer. For example, a signal rewiring line may be electrically connected to a signal terminal (e.g., the seventh pad 351 in FIG. 3) of a driving circuit disposed in the first layer 410 via a via so as to electrically connect a data wiring line disposed in the first layer 410 to a data pin disposed on the second face 402. For example, a power rewiring line may be electrically connected to a power terminal (e.g., the tenth pad 354 in FIG. 3) of a driving circuit disposed in the first layer 410 via a via so as to electrically connect a VDD wiring line disposed in the first layer 410 to a data pin disposed on the second face 402. According to an embodiment, the wiring layer 432 may include a plurality of layers. For example, wiring lines may be arranged vertically in the first wiring layer, and wiring lines may be arranged horizontally in the second wiring layer disposed on the first wiring layer.

Referring to FIG. 4D, an LED 440 may be disposed in the second layer 420 such that the light-emitting portion 441 thereof faces the first layer 410. A first conductive pattern 451 and a second conductive pattern 452 may be located in the conductive pattern layer 431 of the third layer 430. The first conductive pattern 451 may be electrically connected to the first electrode 442 of the LED 440 and electrically connected to a driving circuit (e.g., the fifth pad 345 in FIG. 3) disposed in the first layer, thereby electrically connecting the first electrode 442 to the driving circuit. The second conductive pattern 452 may be electrically connected to the second electrode 443 of the LED 440 and electrically connected to a driving circuit (e.g., the sixth pad 346 in FIG. 3) disposed in the first layer 410, thereby electrically connecting the second electrode 443 to the driving circuit.

According to various embodiments, at least one of the terminals (e.g., the seventh to sixteenth pads 351 to 360 in FIG. 3) of driving circuits may be electrically connected to a (re)wiring line 470 formed in the third layer 430 via the first via 461, and the (re)wiring line 470 may be electrically connected to a pin 471 disposed on the second face 402 via the second via 472. According to some embodiments, the pin 471 may be directly connected to the (re)wiring line 470, thereby being electrically connected to the (re)wiring line 470 without the second via 472.

Figure 5:
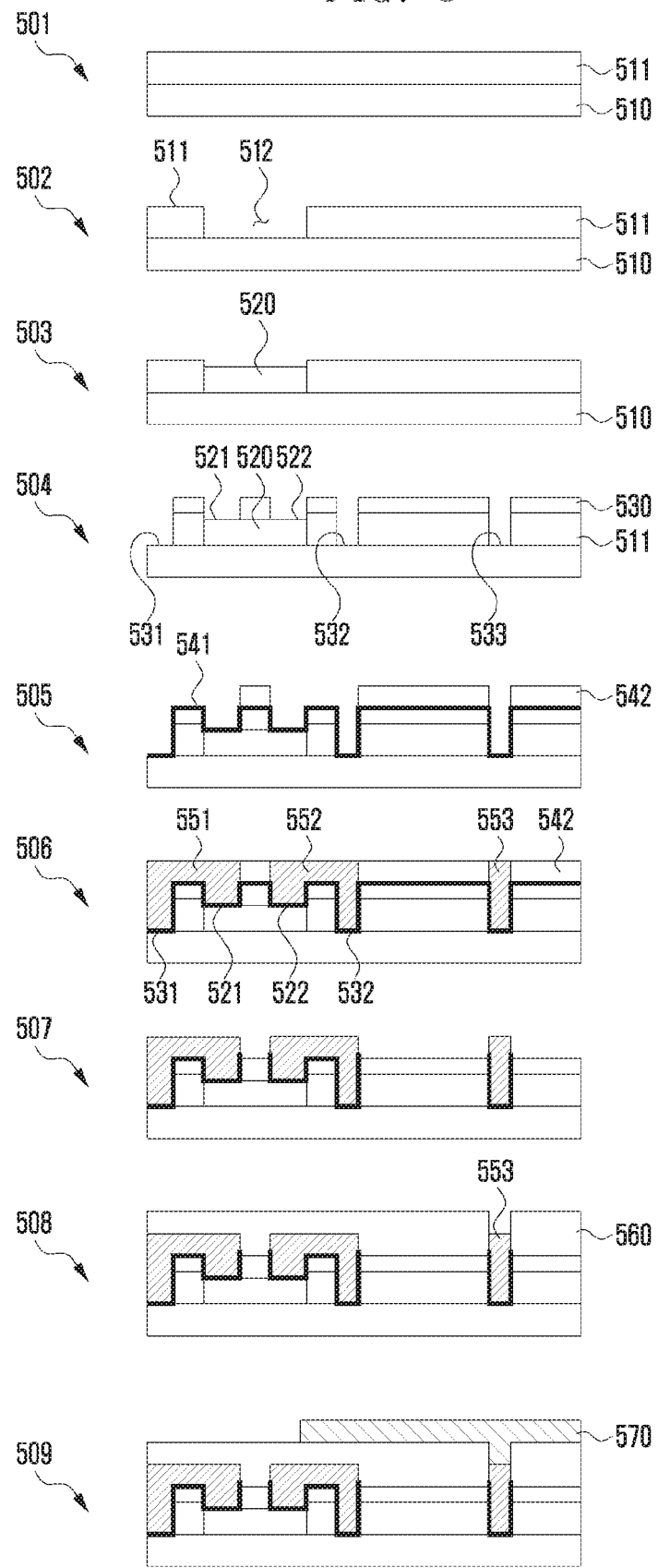
FIG. 5 is a diagram illustrating an example method for manufacturing a display according to various embodiments.

FIG. 5 is a diagram illustrating an example of a method for manufacturing a display (e.g., the display 400 in FIGS. 4A to 4D) according to various embodiments.

Referring to reference numeral 501, in a thin film transistor (TFT) substrate 510 (e.g., the first layer 410 in FIG. 4C) prepared as a component of a display, a first film 511 may be attached to a face in which a driving circuit and wiring lines are formed. As the method of attaching the film, for example, a laminating process may be used, in which a photosensitive dry film is pressed onto a substrate by a heated roller to adhere to the substrate.

Referring to reference numeral 502, a portion of the first film 511 may be removed so as to form a pocket 512 on the TFT substrate 510 to accommodate an LED therein. For example, the pocket 512 may be formed by sequentially performing a masking process, an exposure process, a developing process, and an etching process, which are well known in the field of semiconductor design.

Referring to reference numeral 503, an LED 520 may be disposed in the pocket in the state in which the light-emitting face of the LED 520 faces the substrate 510. For example, the pocket may be coated with a liquid transparent adhesive. In this state, a process of placing the LED 520 in the pocket is performed, and then heat or ultraviolet rays are applied to the transparent adhesive, thereby curing the transparent adhesive, so that the LED 520 can be secured to the pocket.

Referring to reference numeral 504, a second film 530 may be attached to the first film 511 and the LED 520 through, for example, a laminating process. Portions of the second film 530 located on the electrodes 521 and 522 may be removed. In addition, in the driving circuit, the portions of the films 511 and 530, which are located on the pads 531 and 532 to be electrically connected to the electrodes 521 and 522, respectively, may be removed. In addition, portions of the films 511 and 530, which are located on at least one pad 533 to be electrically connected to a wiring line (e.g., the wiring 470 in FIG. 4), may be removed. Processes for partially removing the films 511 and 530 may include, for example, and without limitation, masking, exposure, development, and etching processes.

Referring to reference numeral 505, a seed metal 541 may be deposited over the front face, and a third film 542 may be deposited over the metal-deposited front face through, for example, a laminating process. A portion of the third film 542 may be removed in order to form conductive patterns and vias. Processes for partially removing the third film 542 may include, for example, and without limitation, masking, exposure, development, and etching processes.

Referring to reference numeral 506, the conductive patterns 551 and 552 and the vias 553 may be formed on the front face through, for example, an electroplating method. An electrical connection between the first electrode 521 and the first pad 531 may be achieved by the formed first conductive pattern 551. An electrical connection between the second electrode 522 and the second pad 532 may be achieved by the formed second conductive pattern 552.

Referring to reference numerals 506 and 507, a process of removing the remaining portion of the third film 542 attached to the front face and the seed metal formed under the third film 542 may be performed. This process may include a photolithography process well-known in the semiconductor design field.

Referring to reference numeral 508, a process of attaching a fourth film 560 to the front face and exposing the vias 553 may be performed. The process may include, for example, and without limitation, laminating, masking, exposure, development, and etching processes.

Referring to reference numeral 509, a process of forming a wiring line 570 on the front face may be performed. This process may include the same processes as those described with reference to reference numerals 505, 506, and 507.

According to some embodiments, a further process of attaching a plurality of pins (e.g., the pins 404 in FIG. 4B) to the face on which the wiring line 570 is formed may be further performed.

According to some embodiments, a process of further laminating at least one wiring line on the wiring line 570 may be additionally performed, and a process of attaching pins to the wiring layer located in the uppermost layer may be performed.

According to some embodiments, the display fabricated through the processes of FIG. 5 may be cut into multiple units (e.g., 11*11 units based on the pin arrangement as illustrated in FIG. 4B). Later, a process of attaching these units to each other may be performed, thereby making it possible to manufacture various sizes of displays (e.g., smart phone displays, TV displays, or electric sign board displays).

Figure 6:
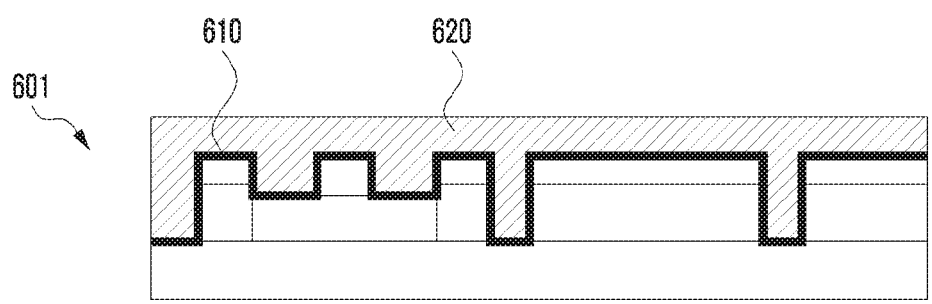
FIG. 6 is a diagram illustrating another example method for manufacturing a display according to various embodiments.
Figure 6:
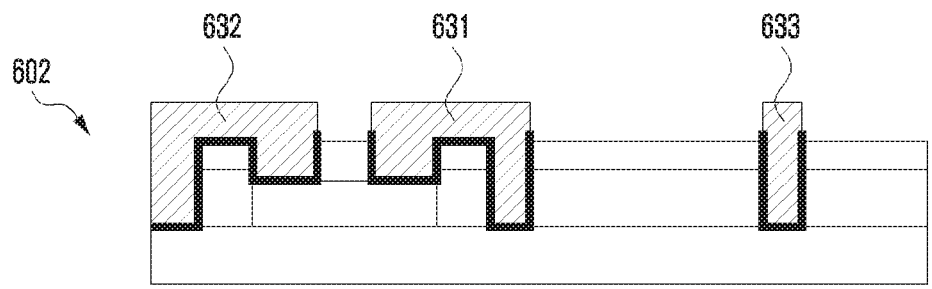
Figure 6:
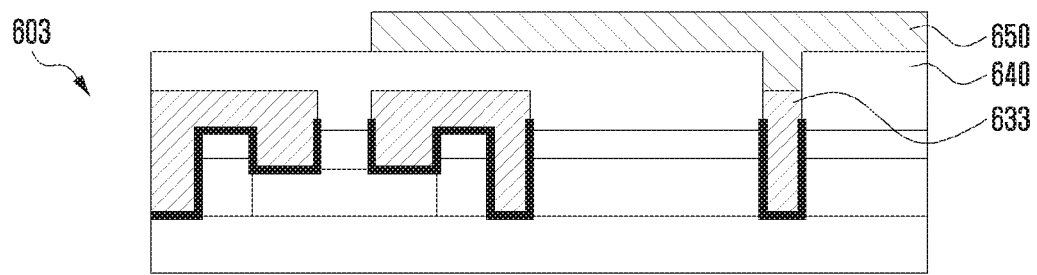

FIG. 6 is a diagram illustrating another example of a method for manufacturing a display (e.g., the display 400 in FIGS. 4A to 4D) according to various embodiments.

Referring to reference numeral 601, the same processes as those described above with reference to reference numerals 501, 502, 503, and 504 are sequentially performed. Then, a seed metal layer 610 is deposited on the front face, and a conductive layer 620 may be formed on the metal-deposited front face through, for example, an electroplating method.

Referring to reference numeral 602, a process of forming conductive patterns 631 and 632 and a via 633 on the front face may be performed. For example, the process may include a photolithographic process.

Referring to reference numeral 603, a process of attaching the film 640 to the front face and exposing the via 633 may be performed. The process may include laminating, masking, exposure, development, and etching processes. Next, a process of forming a wiring line 650 on the front face may be performed, which may include processes that are the same as those described with reference to reference numerals 601 and 602.

According to some embodiments, a process of additionally attaching a plurality of pins to the face on which the wiring line 650 is formed may be further performed.

According to some embodiments, a process of further laminating at least one wiring line on the wiring line 650 may be additionally performed. A process of attaching pins to the wiring layer located on the uppermost layer may be further performed.

According to some embodiments, the display manufactured through the processes of FIG. 6 may be cut into multiple predetermined units, and these display units may be used for manufacturing displays of various sizes through a process of attaching the display units together.

Figure 7:
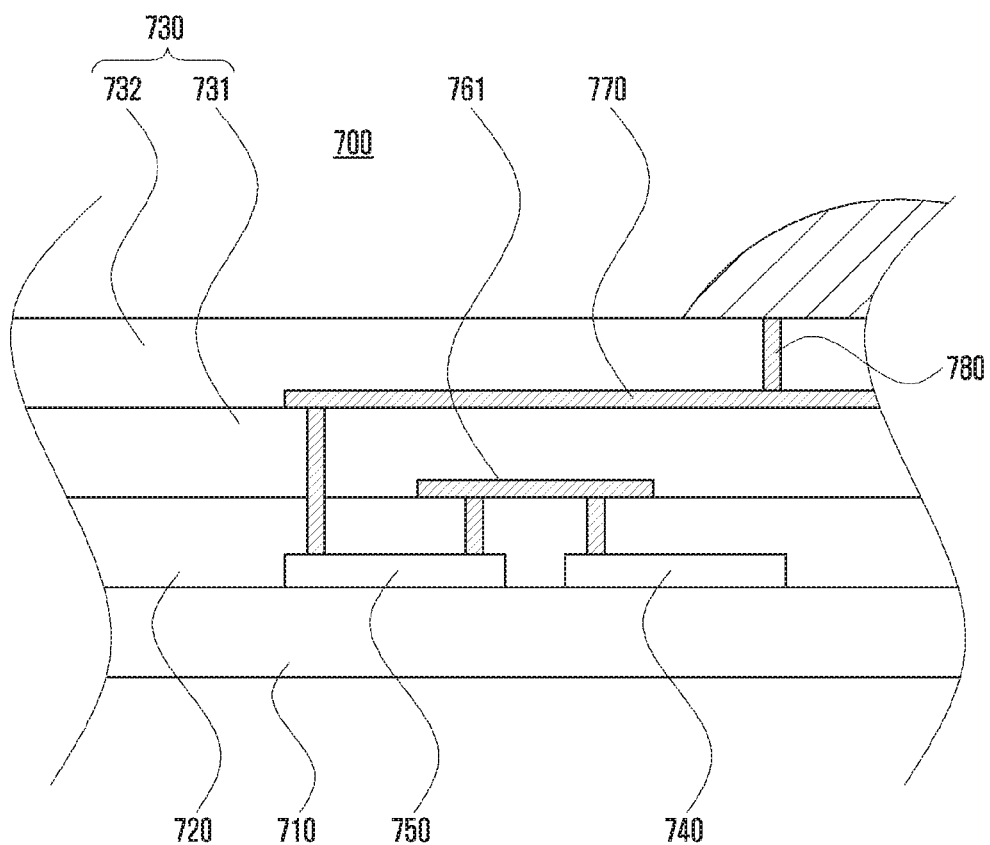
FIG. 7 is a diagram illustrating a portion (pixel region) in a cut face of the display according to various embodiments.

FIG. 7 is a diagram illustrating a portion (pixel region) in a cut face of the display according to various embodiments. Referring to FIG. 7, a display 700 according to various embodiments may include a first layer 710, a second layer 720, and a third layer 730.

According to various embodiments, the first layer 710 may be a substrate for a plurality of driver circuit chips and a plurality of LEDs. For example, the substrate may be made of glass or a plastic material.

According to various embodiments, the second layer 720 may include a plurality of pixels (e.g., the pixels P in FIG. 2). Each of the pixels may include a plurality of LEDs, including an illustrated LED 740, and a driver circuit chip 750 for driving the LEDs. The LEDs may be disposed in the second layer 720 such that the light-emitting portions thereof face the first layer 710.

According to various embodiments, the third layer 730 may include conductive patterns configured to electrically connect driving circuit chips to RGB LEDs, and wiring lines configured to electrically connect the driving circuit chips to external devices (e.g., the DDI 220 and power management device 230). According to an embodiment, the third layer 730 may include a conductive pattern layer 731 and a wiring layer 732 formed on the conductive pattern layer 731. The conductive pattern layer 731 may include at least a portion of the conductive pattern 761 configured to electrically connect the LED 740 to the driver circuit chip 750. The wiring layer 732 may include a wiring line 770, electrically connected to the driving circuit chip 750 located in the second layer 720, and a via 780, electrically connected to the wiring line 770 and exposed to the outside. An external device may be electrically connected to the driving circuit chip 750 through the via 780.

Figure 8:
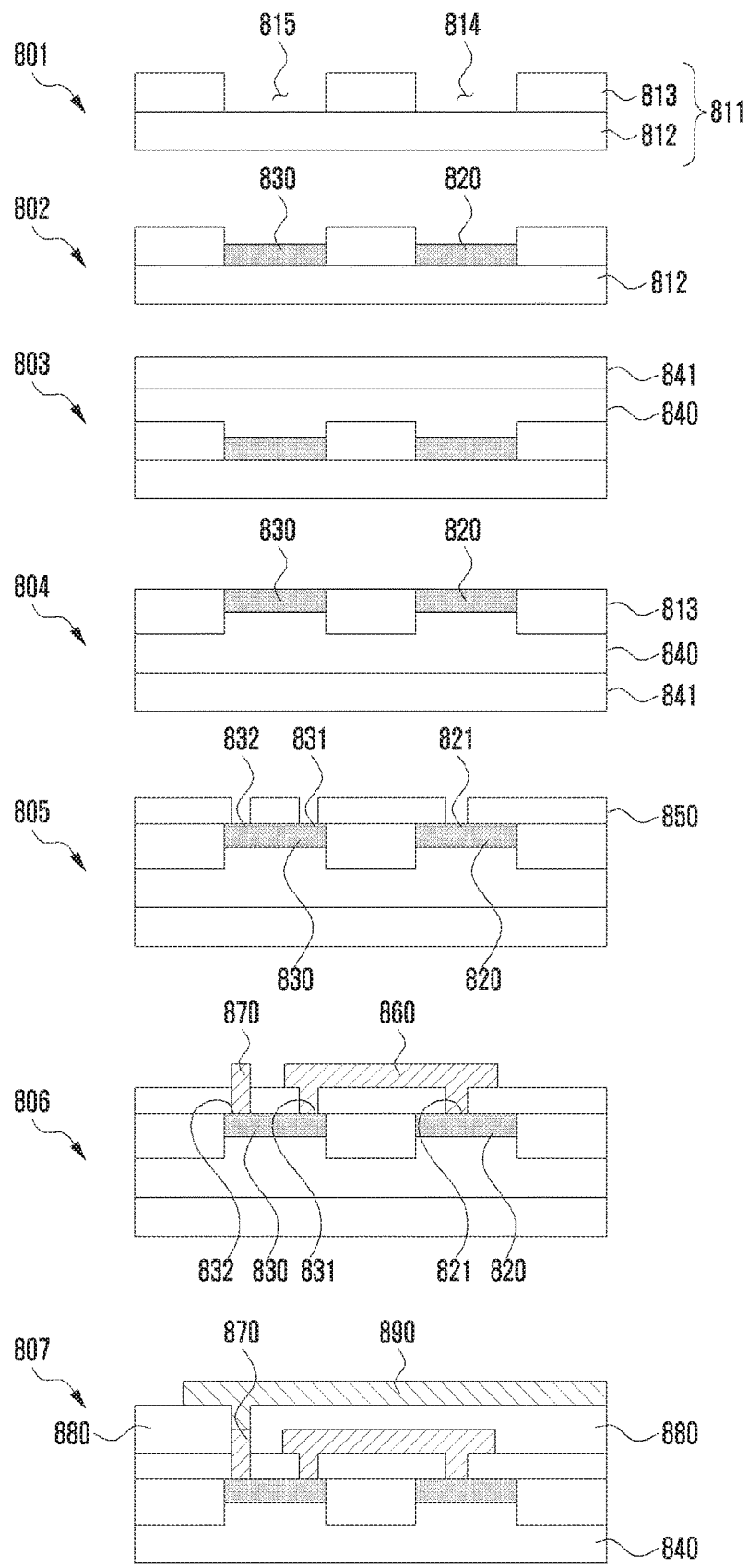
FIG. 8 is a diagram illustrating an example of a method for manufacturing a display according to various embodiments.

FIG. 8 is a diagram illustrating an example of a method for manufacturing a display (e.g., the display 700 in FIG. 7) according to various embodiments.

Referring to reference numeral 801, a substrate 811 may be provided to arrange driving circuit chips and LEDs. For example, the substrate 811 may include two layers 812 and 813. In the process of manufacturing the substrate 811, the two layers 812 and 813 may be affixed to each other using, for example, a silicon pressure-sensitive adhesive. Although not limited thereto, the first layer 812 may be made of PET, and the second layer 813 attached to the first layer 812 may be made of copper (Cu). A portion of the second layer 813 may be removed so that a first pocket 814 configured to accommodate an LED and a second pocket 815 configured to receive a driver circuit chip may be formed in the first layer 812. These pockets 814 and 815 may be formed by sequentially performing, for example, masking, exposure, development, and etching processes.

Referring to reference numeral 802, the pockets are coated with a liquid transparent adhesive, an LED 820 is positioned in the first pocket in the state in which the light-emitting face of the LED 820 faces the first layer 812, and a driving chip 830 may be located in the second pocket. Then, heat or ultraviolet light is applied to the adhesive, thereby curing the transparent adhesive, so that the LED 820 and the driving circuit chip 830 can be fixed to the respective pockets.

Referring to reference numeral 803, a first film 840 (e.g., the first layer 710 in FIG. 7) may be attached to the front face through, for example, a laminating process. Then, a carrier 841 may be attached to the first film 840.

Referring to reference numeral 804, the display is turned over such that the first film 840 is positioned on the underside, and a process of removing the first film 840 layer attached to the second layer 813, the LED 820, and the driving circuit chip 830 may be performed.

Referring to reference numeral 805, a process of attaching a second film 850 to the front face may be performed. Then, the portion of the second film 850 located above an electrode 821 may be removed. Further, the portion of the second film 850, located on the portion 831 to be electrically connected to the electrode 821 in the driving circuit chip 830, may be removed. In addition, the portion of the second film 850, located on at least one terminal 832 to be electrically connected to a wiring line (e.g., the wiring line 770 in FIG. 7), may be removed. Processes for partially removing the second film 850 may include, for example, and without limitation, masking, exposure, development, and etching processes.

Referring to reference numeral 806, a process of forming a conductive pattern 860 on the front face to electrically connect the electrode 821 to a portion 831 of the driving circuit chip 830 may be performed. In addition, a process of forming a via 870 in the front face to electrically connect the terminal 832 to the wiring line may be performed. These processes may include a photolithographic process.

Referring to reference numeral 807, a process of attaching a third film 880 to the front face and exposing the via 870 may be performed. The process may include, for example, and without limitation, laminating, masking, exposure, development, and etching processes. Next, a process of forming a wiring line 890 on the front face may be performed. The process may include a photolithographic process. In addition, a process of removing a carrier attached to the first film 840 may be performed.

According to some embodiments, a further process of attaching a plurality of pins (e.g., the pins 404 in FIG. 4B) to the face on which the wiring line 890 is formed may be further performed.

According to some embodiments, a process of further laminating at least one wiring line on the wiring line 890 may be additionally performed. A process of attaching pins to the wiring layer located on the uppermost layer may be further performed.

According to some embodiments, the display manufactured through the processes of FIG. 8 may be cut into multiple predetermined units, and these display units may be used for manufacturing displays of various sizes through a process of attaching the display units together.

Figure 9:
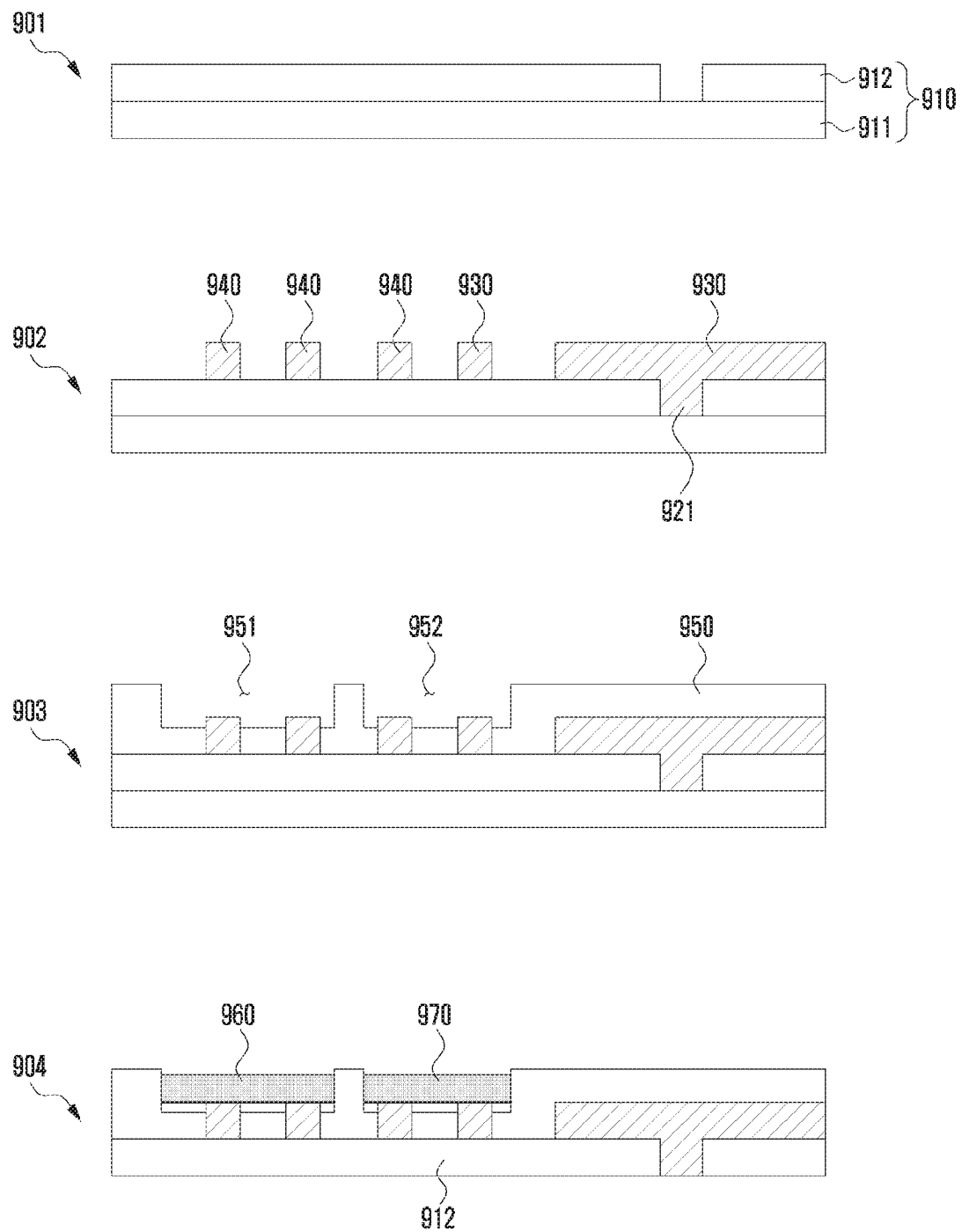
FIG. 9 is a diagram illustrating another example of a method for manufacturing a display according to various embodiments.

FIG. 9 is a diagram illustrating another example of a method for manufacturing a display (e.g., the display 700 in FIG. 7) according to various embodiments.

Referring to reference numeral 901, a substrate 910 may be provided so as to form a wiring line and a conductive pattern. For example, the substrate 910 may include two layers 911 and 912. In the process of manufacturing the substrate 910, the two layers 911 and 912 may be affixed to each other using, for example, a silicon pressure-sensitive adhesive. Although not illustrated thereto, the first layer 911 may be made of PET. The second layer 912 (e.g., the third layer 730 in FIG. 7) may be made of glass. A portion of the second layer 912 may be removed to form a via for connection to external devices (e.g., the DDI 220 and the power management device 230 in FIG. 2). For example, in order to remove the portion, masking, exposure, development, and etching processes may be performed sequentially.

Referring to reference numeral 902, a process of forming a via 921, a wiring line 930, and a conductive pattern 940 on the front face may be performed. The process may include a photolithographic process.

Referring to reference numeral 903, a process of attaching the film 950 to the front face (e.g., including a laminating process) may be performed. Then, a process of forming a first pocket 951 configured to accommodation an LED and a second pocket 952 configured to accommodate a driving circuit chip may be performed. These pockets 951 and 952 may be formed by sequentially performing, for example, and without limitation, masking, exposure, development, and etching processes. In addition, according to the above processes, portions for connection with the driving circuit chip in the conductive pattern 940 and the wiring line 930 may be exposed to the outside through the pockets 951 and 952.

Referring to reference numeral 904, the pockets are coated with a liquid transparent adhesive, an LED 960 is positioned in the first pocket in the state in which the light-emitting face of the LED 960 faces away from the second layer 912, and a driving chip 970 may be located in the second pocket. Then, heat or ultraviolet light is applied to the adhesive, thereby curing the transparent adhesive, so that the LED 960 and the driving circuit chip 970 can be fixed to the respective pockets. In addition, a process of removing the first layer attached to the second layer 912 may be performed. According to some embodiments, a process for attaching a film (not illustrated), for protecting the LED 960 and the driving circuit chip 970, to the front face may be additionally performed.

According to some embodiments, the display manufactured through the processes of FIG. 9 may be cut into multiple predetermined units, and these display units may be used for manufacturing displays of various sizes through a process of attaching the display units together.

The term "on" as used herein can mean either directly on and contacting, or indirectly on with other elements therebetween. For example, and without limitation, a layer can be "on" another layer even though other layer(s) may be located therebetween.

A first display according to various embodiments of the present disclosure may include: a first face oriented in a first direction; a second face oriented in a second direction opposite the first direction; a plurality of pixels disposed in a space between the first face and the second face; and a plurality of pins disposed on the second face and configured to electrically connect the plurality of pixels to an external device. Each of the plurality of pixels includes a plurality of LEDs and a driving circuit, the plurality of LEDs may be disposed in the space such that light-emitting portions thereof face the first face, a conductive pattern configured to electrically connect the plurality of LEDs to the driving circuit may be located in the space, at least a portion of the conductive pattern being located above the plurality of LEDs when viewed from above the second face, and a wiring line configured to electrically connect the driving circuit to the plurality of pins may be located in the space, the wiring line being located above the plurality of LEDs when viewed from above the second face.

An electronic device according to various embodiments of the present disclosure may include: a display driver IC; a power management device comprising power management circuitry; the first display electrically connected to the display driver IC and to the power management device; and a processor electrically connected to the display driver IC and to the power management device.

The first display may further include: a first layer including the first face and including the driving circuit; a second layer disposed on the first layer and including the plurality of LEDs; a third layer including the second face and disposed on the second layer, the third layer including at least a portion of the conductive pattern and the wiring line; and a via configured to electrically connect the driving circuit to the wiring line, at least a portion of the via being disposed in the second layer. The third layer may include: a conductive pattern layer including at least a portion of the conductive pattern; and at least one wiring layer disposed on the conductive pattern layer and including the wiring line. The conductive pattern may be formed in the space through: a process of disposing the plurality of LEDs on one face on which the driving circuit is disposed in the first layer; a process of attaching a film on the one face after the disposing process; a process of removing a portion of the film such that electrodes of the plurality of LEDs are exposed and a portion of the driving circuit is exposed; and a process of electroplating the electrodes and the portion of the driving circuit after the portion of the film is removed. The first layer may be glass.

The first display may further include: a first layer forming the first face; a second layer disposed on the first layer and including the plurality of LEDs and the chip-type driving circuit; a third layer forming the second face and disposed on the second layer, the third layer including at least a portion of the conductive pattern and the wiring line; and a via configured to electrically connect the driving circuit chip to the wiring line, at least a portion of the via being disposed in the second layer. The third layer may include: a conductive pattern layer including at least a portion of the conductive pattern; and at least one wiring layer disposed on the conductive pattern layer and including the wiring line. The conductive pattern may be formed in the space through: a process of disposing the plurality of LEDs and the driving circuit chip on one face of the first layer; a process of attaching a film on the one face after the disposing process; a process of removing a portion of the film such that electrodes of the plurality of LEDs are exposed and a portion of the driving circuit chip is exposed; and a process of electroplating the electrodes and the portion of the driving circuit after the portion of the film is removed. The first layer may be glass.

A second display according to various embodiments of the present disclosure may include: a first face oriented in a first direction; a second face oriented in a second direction substantially opposite the first direction; and a plurality of pixels disposed in a space between the first face and the second face. Each of the plurality of pixels may include a plurality of LEDs and a driving circuit chip, the plurality of LEDs may be disposed in the space such that light-emitting portions thereof face the first face, a conductive pattern configured to electrically connect the plurality of LEDs to the driving circuit chip may be located in the space in which at least a portion of the conductive pattern is located above the plurality of LEDs when viewed from above the second face, a wiring line configured to electrically connect the driving circuit chip to the plurality of pins may be located in the space in which the wiring line is located above the plurality of LEDs when viewed from above the second face, the second face may be one face of glass, the wiring line may be formed on a remaining face of the glass and may be connected to a via that passes through the one face and the remaining face, and the plurality of pixels may be connected to an external device via the via.

An electronic device according to various embodiments of the present disclosure may include: a display driver IC; a power management device comprising power management circuitry: the second display electrically connected to the display driver IC and to the power management device; and a processor electrically connected to the display driver IC and to the power management device.

In the second display, the conductive pattern, the wiring line, and the via may be located in the space through: a process of removing a portion of the glass through the one face and the remaining face of the glass; a process of forming a via in the portion of the glass and forming the conductive pattern and the wiring on the remaining face of the glass; and a process of disposing the plurality of LEDs on the remaining face such that light-emitting portions of the plurality of LEDs face away from the remaining face, and disposing the driving circuit chip on the remaining circuit chip.

The various example embodiments of the present disclosure disclosed herein and the drawings are simply illustrative examples proposed provided to easily describe the technical matters of the present disclosure and aid in understanding the present disclosure, and do not limit the scope of the present disclosure. Therefore, in addition to the example embodiments disclosed herein, the scope of the various embodiments of the present disclosure should be understood to include all modifications or modified forms based on the technical idea of the various example embodiments of the present disclosure.

What is claimed is:

1. A display comprising:
a first face oriented in a first direction;
a second face oriented in a second direction opposite the first direction;
a plurality of pixels disposed in a space between the first face and the second face; and
a plurality of pins disposed on the second face and configured to electrically connect the plurality of pixels to an external device,
wherein each of the plurality of pixels includes a plurality of LEDs and a driving circuit, the driving circuit is disposed in a first layer including the first face, and the plurality of LEDs are disposed in a second layer disposed on the first layer,
the plurality of LEDs are disposed in the space such that light-emitting portions of the plurality of LEDs face the first face,
a conductive pattern configured to electrically connect the plurality of LEDs to the driving circuit is located in the space, at least a portion of the conductive pattern being located above the plurality of LEDs when viewed from above the second face, and
a wiring line configured to electrically connect the driving circuit to the plurality of pins is located in the space, the wiring line being located above the plurality of LEDs when viewed from above the second face.

2. The display of claim 1, further comprising:
a third layer including the second face and disposed on the second layer, the third layer including at least a portion of the conductive pattern and the wiring line; and
a via configured to electrically connect the driving circuit to the wiring line, at least a portion of the via being disposed in the second layer.

3. The display of claim 2, wherein the third layer includes:
a conductive pattern layer including at least a portion of the conductive pattern; and
at least one wiring layer disposed on the conductive pattern layer and including the wiring line.

4. The display of claim 1, wherein the conductive pattern is formed in the space by a process comprising:
disposing the plurality of LEDs on one face on which the driving circuit is disposed in the first layer;

attaching a film on the one face after the disposing process;

removing a portion of the film such that electrodes of the plurality of LEDs are exposed and a portion of the driving circuit is exposed; and electroplating the exposed electrodes and the exposed portion of the driving circuit after the portion of the film is removed.

5. The display of claim 1, wherein the first layer comprises glass.

6. A display comprising:

a first face oriented in a first direction;

a second face oriented in a second direction opposite the first direction;

a plurality of pixels disposed in a space between the first face and the second face; and a plurality of pins disposed on the second face and configured to electrically connect the plurality of pixels to an external device, wherein each of the plurality of pixels includes a plurality of LEDs and a driving circuit, the plurality of LEDs are disposed in the space such that light-emitting portions of the plurality of LEDs face the first face, a conductive pattern configured to electrically connect the plurality of LEDs to the driving circuit is located in the space, at least a portion of the conductive pattern being located above the plurality of LEDs when viewed from above the second face, and a wiring line configured to electrically connect the driving circuit to the plurality of pins is located in the space, the wiring line being located above the plurality of LEDs when viewed from above the second face;

a first layer including the first face;

a second layer disposed on the first layer and including the plurality of LEDs and the driving circuit, the driving circuit being a chip type;

a third layer including the second face and disposed on the second layer, the third layer including at least a portion of the conductive pattern and the wiring line; and a via configured to electrically connect the driving circuit chip to the wiring line, at least a portion of the via being disposed in the second layer.

7. The display of claim 6, wherein the third layer includes:

a conductive pattern layer including at least a portion of the conductive pattern; and at least one wiring layer disposed on the conductive pattern layer and including the wiring line.

8. The display of claim 6, wherein the conductive pattern is formed in the space by a process comprising:

disposing the plurality of LEDs and the driving circuit chip on one face of the first layer;

attaching a film on the one face after the disposing process;

removing a portion of the film such that electrodes of the plurality of LEDs are exposed and a portion of the driving circuit chip is exposed; and electroplating the exposed electrodes and the exposed portion of the driving circuit after the portion of the film is removed.

9. The display of claim 6, wherein the first layer comprises glass.

10. An electronic device comprising:

a display driver IC;

a power management device comprising power management circuitry:

the display of claim 1 electrically connected to the display driver IC and to the power management device; and a processor electrically connected to the display driver IC and to the power management device.

11. A display comprising:

a first face oriented in a first direction;

a second face oriented in a second direction substantially opposite the first direction;

a plurality of pixels disposed in a space between the first face and the second face, wherein each of the plurality of pixels includes a plurality of LEDs and a driving circuit chip, the driving circuit chip is disposed in a first layer including the first face, and the plurality of LEDs are disposed in a second layer disposed on the first layer, wherein the plurality of LEDs are disposed in the space such that light-emitting portions of the plurality of LEDs face the first face, a conductive pattern configured to electrically connect the plurality of LEDs to the driving circuit chip and being located in the space, at least a portion of the conductive pattern being located above the plurality of LEDs when viewed from above the second face, a wiring line configured to electrically connect the driving circuit chip to the plurality of pins and being located in the space, the wiring line being located above the plurality of LEDs when viewed from above the second face, the second face is one face of glass, the wiring line is disposed on another face of the glass, and is connected to a via that passes through the one face and the another face, and the plurality of pixels is connected to an external device via the via.

12. The display of claim 11, wherein the conductive pattern, the wiring line, and the via are formed in the space by a process comprising:

removing a portion of the glass through the one face and the another face of the glass;

forming a via in the remaining portion of the glass and forming the conductive pattern and the wiring on the another face of the glass; and disposing the plurality of LEDs on the another face such that light-emitting portions of the plurality of LEDs face away from the another face.

13. An electronic device comprising:

a display driver IC;

a power management device comprising power management circuitry:

the display of claim 11 electrically connected to the display driver IC and to the power management device; and a processor electrically connected to the display driver IC and to the power management device.

* * * * *